(12) United States Patent
Chaji et al.

(10) Patent No.: US 8,552,636 B2
(45) Date of Patent: Oct. 8, 2013

(54) HIGH RESOLUTION PIXEL ARCHITECTURE

(75) Inventors: Gholamreza Chaji, Waterloo (CA);
Vasudha Gupta, Cambridge (CA);
Arokia Nathan, Cambridge (GB)

(73) Assignee: Ignis Innovation Inc., Waterloo, Ontario (CA)

( * ) Notice: Subject to any disclaimer, the term of this patent is extended or adjusted under 35 U.S.C. 154(b) by 305 days.

(21) Appl. No.: 12/958,035

(22) Filed: Dec. 1, 2010

(65) Prior Publication Data

US 2011/0128262 A1     Jun. 2, 2011

(30) Foreign Application Priority Data

Dec. 1, 2009   (CA) ..................................... 2686174

(51) Int. Cl.
*H01L 51/52*     (2006.01)
(52) U.S. Cl.
USPC ........... 313/504; 313/503; 313/500; 313/512; 315/169.3
(58) Field of Classification Search
USPC ................. 313/504, 503, 500, 512; 315/169.3
See application file for complete search history.

(56) References Cited

U.S. PATENT DOCUMENTS

| | | | |
|---|---|---|---|
| 4,354,162 A | 10/1982 | Wright | |
| 5,589,847 A | 12/1996 | Lewis | |
| 5,670,973 A | 9/1997 | Bassetti et al. | |
| 5,748,160 A | 5/1998 | Shieh et al. | |
| 5,815,303 A | 9/1998 | Berlin | |
| 6,097,360 A | 8/2000 | Holloman | |
| 6,259,424 B1 | 7/2001 | Kurogane | |
| 6,288,696 B1 | 9/2001 | Holloman | |
| 6,320,325 B1 | 11/2001 | Cok et al. | |
| 6,414,661 B1 | 7/2002 | Shen et al. | |
| 6,580,567 B1 | 6/2003 | Lindner | |
| 6,594,606 B2 | 7/2003 | Everitt | |
| 6,618,030 B2 | 9/2003 | Kane et al. | |
| 6,687,266 B1 | 2/2004 | Ma et al. | |
| 6,690,344 B1 | 2/2004 | Takeuchi et al. | |
| 6,693,388 B2 | 2/2004 | Oomura | |

(Continued)

FOREIGN PATENT DOCUMENTS

| CA | 1294034 | 1/1992 |
|---|---|---|
| CA | 2368386 | 9/1999 |

(Continued)

OTHER PUBLICATIONS

International Search Report corresponding to International Application No. PCT/IB2010/055541 filed Dec. 1, 2010, dated May 26, 2011; 5 pages.

(Continued)

*Primary Examiner* — Mary Ellen Bowman
(74) *Attorney, Agent, or Firm* — Nixon Peabody LLP

(57) ABSTRACT

A high resolution pixel using organic light emitting devices (OLEDs) in a staggered arrangement to increase aperture ratio is disclosed. The arrangement may be used with both bottom and top emission type pixels. The arrangement includes a first organic light emitting device emitting light of a first color. A second organic light emitting device emitting light of a second color is located in a bottom row under the first organic light emitting device. A third organic light emitting device emitting light of a third color is located in a top row with the first organic light emitting device.

14 Claims, 6 Drawing Sheets

(56) References Cited

U.S. PATENT DOCUMENTS

| | | | |
|---|---|---|---|
| 6,720,942 B2 | 4/2004 | Lee et al. | |
| 6,738,035 B1 | 5/2004 | Fan | |
| 6,771,028 B1 | 8/2004 | Winters | |
| 6,777,712 B2 | 8/2004 | Sanford et al. | |
| 6,806,638 B2 | 10/2004 | Lih et al. | |
| 6,809,706 B2 | 10/2004 | Shimoda | |
| 6,909,419 B2 | 6/2005 | Zavracky et al. | |
| 6,937,215 B2 | 8/2005 | Lo | |
| 6,943,500 B2 | 9/2005 | LeChevalier | |
| 6,995,510 B2 | 2/2006 | Murakami et al. | |
| 6,995,519 B2 | 2/2006 | Arnold et al. | |
| 7,027,015 B2 | 4/2006 | Booth, Jr. et al. | |
| 7,034,793 B2 | 4/2006 | Sekiya et al. | |
| 7,106,285 B2 | 9/2006 | Naugler | |
| 7,274,363 B2 | 9/2007 | Ishizuka et al. | |
| 7,321,348 B2 | 1/2008 | Cok et al. | |
| 7,368,868 B2 * | 5/2008 | Sakamoto | 313/505 |
| 7,502,000 B2 | 3/2009 | Yuki et al. | |
| 7,535,449 B2 | 5/2009 | Miyazawa | |
| 7,554,512 B2 | 6/2009 | Steer | |
| 7,619,594 B2 | 11/2009 | Hu | |
| 7,619,597 B2 | 11/2009 | Nathan et al. | |
| 7,994,712 B2 | 8/2011 | Sung et al. | |
| 8,049,420 B2 | 11/2011 | Tamura et al. | |
| 2002/0084463 A1 | 7/2002 | Sanford et al. | |
| 2002/0101172 A1 | 8/2002 | Bu | |
| 2002/0158823 A1 | 10/2002 | Zavracky et al. | |
| 2002/0186214 A1 | 12/2002 | Siwinski | |
| 2002/0190924 A1 | 12/2002 | Asano et al. | |
| 2002/0190971 A1 | 12/2002 | Nakamura et al. | |
| 2002/0195967 A1 | 12/2002 | Kim et al. | |
| 2003/0020413 A1 | 1/2003 | Oomura | |
| 2003/0030603 A1 | 2/2003 | Shimoda | |
| 2003/0076048 A1 | 4/2003 | Rutherford | |
| 2003/0151569 A1 | 8/2003 | Lee et al. | |
| 2003/0179626 A1 | 9/2003 | Sanfod et al. | |
| 2004/0066357 A1 | 4/2004 | Kawasaki | |
| 2004/0135749 A1 | 7/2004 | Kondakov et al. | |
| 2004/0183759 A1 | 9/2004 | Stevenson et al. | |
| 2004/0189627 A1 | 9/2004 | Shirasaki et al. | |
| 2004/0257355 A1 | 12/2004 | Naugler | |
| 2005/0017650 A1 | 1/2005 | Fryer et al. | |
| 2005/0073264 A1 * | 4/2005 | Matsumoto | 315/169.3 |
| 2005/0110420 A1 | 5/2005 | Arnold et al. | |
| 2005/0140610 A1 | 6/2005 | Smith et al. | |
| 2005/0145891 A1 | 7/2005 | Abe | |
| 2005/0156831 A1 | 7/2005 | Yamazaki et al. | |
| 2006/0038758 A1 | 2/2006 | Routley et al. | |
| 2006/0097628 A1 | 5/2006 | Suh et al. | |
| 2006/0097631 A1 * | 5/2006 | Lee | 313/504 |
| 2006/0232522 A1 | 10/2006 | Roy et al. | |
| 2007/0080908 A1 | 4/2007 | Nathan et al. | |
| 2007/0182671 A1 | 8/2007 | Nathan et al. | |
| 2008/0001525 A1 | 1/2008 | Chao et al. | |

FOREIGN PATENT DOCUMENTS

| | | |
|---|---|---|
| CA | 2432530 | 7/2002 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CN | 1760945 | 4/2006 |
| EP | 0 158 366 | 10/1985 |
| EP | 1 194 013 | 3/2002 |
| EP | 1 335 430 A1 | 8/2003 |
| EP | 1 381 019 | 1/2004 |
| EP | 1 521 203 A2 | 4/2005 |
| EP | 1 594 347 | 11/2005 |
| JP | 10-254410 | 9/1998 |
| JP | 2002-278513 | 9/2002 |
| JP | 2003-076331 | 3/2003 |
| JP | 2003-308046 | 10/2003 |
| TW | 473622 | 1/2002 |
| TW | 1221268 | 9/2004 |
| TW | 1223092 | 11/2004 |
| WO | 9948079 | 9/1999 |
| WO | 01/27910 A1 | 4/2001 |
| WO | 03/034389 | 4/2003 |
| WO | 03/063124 | 7/2003 |
| WO | 2004/003877 | 1/2004 |
| WO | 2004/034364 | 4/2004 |
| WO | 2005/022498 | 3/2005 |
| WO | 2005/055185 | 6/2005 |
| WO | 2006/063448 | 6/2006 |
| WO | 2009/055920 A1 | 5/2009 |

OTHER PUBLICATIONS

Written Opinion of the International Searching Authority corresponding to International Application No. PCT/IB2010/055541, dated May 26, 2011; 6 pages.

Ahnood et al.: "Effect of threshold voltage instability on field effect mobility in thin film transistors deduced from constant current measurements"; dated Aug. 2009.

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T—and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A novel driving scheme for high-resolution large-area a-Si:H AMOLED displays"; dated Aug. 2005 (4 pages).

Chaji et al.: "A Stable Voltage-Programmed Pixel Circuit for a-Si:H AMOLED Displays"; dated Dec. 2006 (12 pages).

Chaji et al.: "A Sub-µA fast-settling current-programmed pixel circuit for AMOLED displays"; dated Sep. 2007.

Chaji et al.: "An Enhanced and Simplified Optical Feedback Pixel Circuit for AMOLED Displays"; dated Oct. 2006.

Chaji et al.: "Compensation technique for DC and transient instability of thin film transistor circuits for large-area devices"; dated Aug. 2008.

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

Chaji et al.: "eUTDSP: a design study of a new VLIW-based DSP architecture"; dated May 2003 (4 pages).

Chaji et al.: "Fast and Offset-Leakage Insensitive Current-Mode Line Driver for Active Matrix Displays and Sensors"; dated Feb. 2009 (8 pages).

Chaji et al.: "High Speed Low Power Adder Design With a New Logic Style: Pseudo Dynamic Logic (SDL)"; dated Oct. 2001 (4 pages).

(56) References Cited

OTHER PUBLICATIONS

Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
Jafarabadiashtiani et al.: "A New Driving Method for a-Si AMOLED Displays Based on Voltage Feedback"; dated 2005 (4 pages).
Joon-Chul Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
Lee et al.: "Ambipolar Thin-Film Transistors Fabricated by PECVD Nanocrystalline Silicon"; dated 2006 (6 pages).
Ma E Y et al.: "organic light emitting diode/thin film transistor integration for foldable displays" dated Sep. 15, 1997(4 pages).
Matsueda y et al.: "35.1: 2.5-in. AMOLED with Integrated 6-bit Gamma Compensated Digital Data Driver"; dated May 2004.
Nathan A. et al., "Thin Film imaging technology on glass and plastic" ICM 2000, proceedings of the 12 international conference on microelectronics, dated Oct. 31, 2001 (4 pages).
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

\* cited by examiner

HIGH RESOLUTION PIXEL ARCHITECTURE

PRIORITY CLAIM

This application claims priority to Canadian Application No. 2,686,174, which was filed Dec. 1, 2009.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention generally relates to active matrix organic light emitting device (AMOLED) displays, and particularly to a pixel structure that has a larger aperture ratio in such displays.

BACKGROUND

Currently, active matrix organic light emitting device ("AMOLED") displays are being introduced. The advantages of such displays include lower power consumption, manufacturing flexibility and faster refresh rate over conventional liquid crystal displays. In contrast to conventional liquid crystal displays, there is no backlighting in an AMOLED display as each pixel consists of different colored organic light emitting devices (e.g., red, green and blue) emitting light independently. The organic light emitting diodes (OLED) emit light based on current supplied through a drive transistor. The drive transistor is typically a thin film transistor (TFT) fabricated from either amorphous silicon or polysilicon. The power consumed in each OLED has a direct relation with the magnitude of the generated light in that OLED.

The drive-in current of the drive transistor determines the pixel's luminance and the surface (aperture) of the actual OLED device determines the pixel's OLED lifetime. AMOLED displays are typically fabricated from the OLED, the drive transistor, any other supporting circuits such as enable or select transistors as well as various other drive and programming lines. Such other components reduce the aperture of the pixel because they do not emit light but are needed for proper operation of the OLED.

Generally color displays have three OLEDs arranged in a "stripe" for each pixel 10 as shown in FIG. 1A. The pixel 10 in FIG. 1A is a bottom emission type OLED where the OLEDs are fabricated on the substrate of the integrated circuit where there are no other components such as transistors and metal lines. The pixel 10 includes OLEDs 12, 14 and 16 and corresponding drive transistors 22, 24 and 26 arranged in parallel creating a "stripe" arrangement. Parallel power lines 32, 34 and 36 are necessary to provide voltage to the OLEDs 12, 14 and 16 and drive transistors 22, 24 and 26. The OLEDs 12, 14 and 16 emit red, green and blue light respectively and different luminance levels for each OLED 12, 14 and 16 may be programmed to produce colors along the spectrum via programming voltages input from a series of parallel data lines 42, 44 and 46. As shown in FIG. 1A, additional area must be reserved for a select line 50 and the data lines 42, 44 and 46 as well as the power lines 32, 34 and 36 for the OLEDs 12, 14 and 16 and the drive transistors 22, 24 and 26. In this known configuration, the aperture of the integrated circuit of the pixel 10 is much less than the overall area of the integrated circuit because of the areas needed for the drive transistor and power and data lines. For example, in producing a shadow mask for fabricating such an integrated circuit for the pixel 10, the distance between two adjacent OLEDs such as the OLEDs 12 and 14 and the OLED size is significant (larger than 20 um). As a result, for high resolution display (e.g. 253 ppi with 33.5 um sub pixel width), the aperture ratio will be very low.

FIG. 1B shows a circuit diagram of the electronic components, namely the OLED 12, the drive transistor 22, the power input for the drive voltage line 32 and the programming voltage input 42 for each of the color OLEDs that make up the pixel 10. The programming voltage input 42 supplies variable voltage to the drive transistor 22 that in turn regulates the current to the OLED 12 to determine the luminance of the OLED 12.

FIG. 1C shows the cross section for the conventional bottom emission structure such as for the pixel 10 in FIG. 1A. As is shown, OLED 12 is fabricated to the side of the other components on the substrate in an open area. Thus, the OLED light emission area is limited by the other components in the pixel. A common electrode layer 70 provides electrical connection to the OLED 12. In this case, the current density is high because of the limited area for light emission. The OLED voltage is also high due to higher current density. As a result, the power consumption is higher and the OLED lifetime is reduced.

Another type of integrated circuit configuration for each of the OLEDs that make up the pixel involves fabricating the OLED over the backplane components (such as transistors and metal traces) and is termed a top emission configuration. The top emission configuration allows greater surface area for the OLED and hence a higher aperture ratio, but requires a thinner common electrode to the OLEDs because such an electrode must be transparent to allow light to be emitted from the OLEDs. The thin electrode results in higher resistance and causes significant voltage drop across this electrode. This may be an issue for larger area displays which in nature need a larger area common electrode.

Therefore, currently, the apertures of pixels for OLED displays are limited due to the necessity of drive transistors and other circuitry. Further, the aperture ratios of the OLEDs in OLED displays are also limited because of the necessity to have a minimal amount of space between OLEDs due to design rule requirements. Therefore, there is a need for increasing the aperture ratios of OLED based integrated circuit pixels for higher resolution displays.

SUMMARY

Aspects of the present disclosure include an integrated circuit for a color pixel, the circuit. The integrated circuit has a first organic light emitting device emitting light of a first color. A second organic light emitting device emits light of a second color. The second organic light emitting device is located under the first organic light emitting device. A third organic light emitting device emits light of a third color and is in alignment with the first organic light emitting device and above the second organic light emitting device.

Another example is a color display having a controller and an array of pixels coupled to the controller to display images. Each pixel includes a first organic light emitting device emitting light of a first color. Each pixel includes a second organic light emitting device emitting light of a second color. The second organic light emitting device is located in a bottom row under the first organic light emitting device. A third organic light emitting device emitting light of a third color is located in a top row with the first organic light emitting device. Corresponding first, second and third drive transistors are coupled to the first, second and third organic light emitting devices respectively.

Another example is an integrated circuit for a pixel. The integrated circuit includes a common electrode layer and an organic light emitting device located on the common electrode layer. The organic light emitting device includes an emission surface. A drive transistor is disposed on part of the emission surface. A reflector layer is disposed between the drive transistor and the organic light emitting device. The reflector layer includes an aperture over the emission surface and a reflective surface facing the emission surface. The reflective surface reflects light emitted from the light emitting surface through the aperture.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1A:
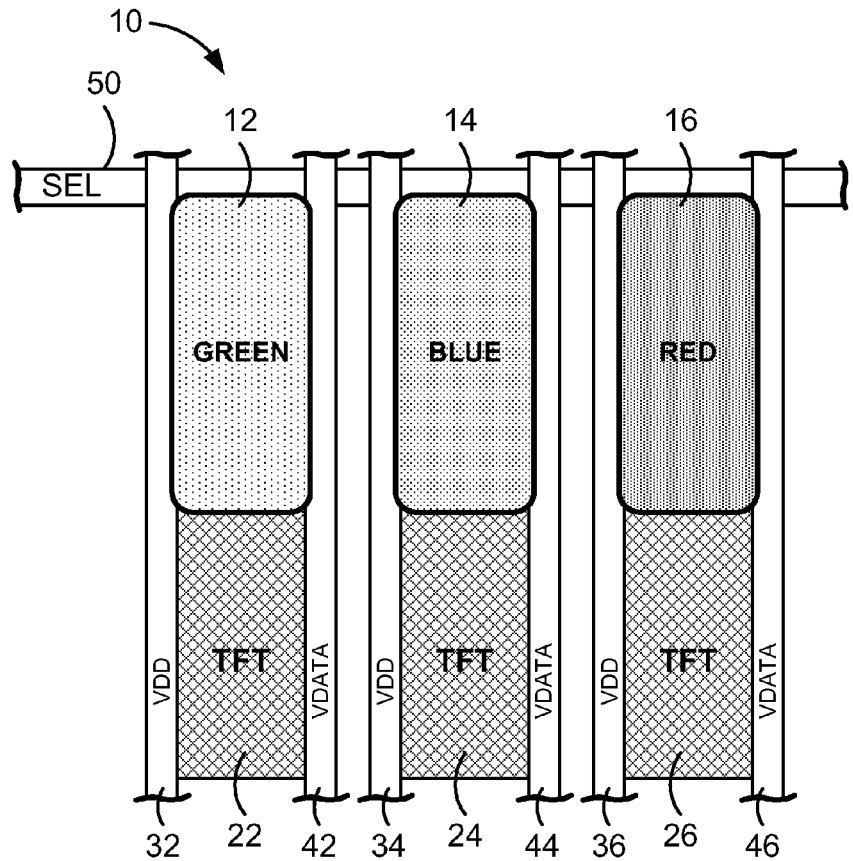
FIG. 1A is a layout of a prior art integrated circuit for an OLED pixel.
Figure 1C:
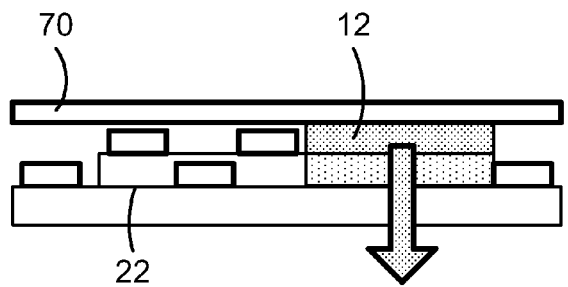
FIG. 1C is a side view of the integrated circuit of the OLED pixel in FIG. 1A.
Figure 1B:
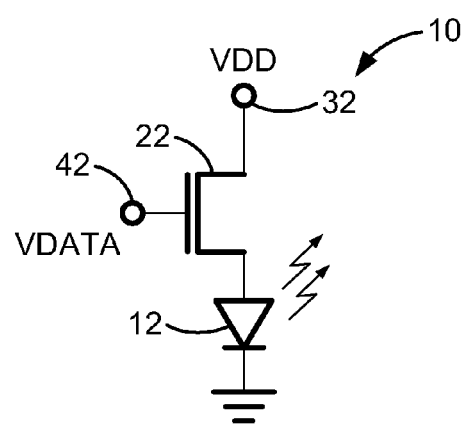
FIG. 1B is a circuit diagram of one of the OLEDs and corresponding drive transistor for the OLED pixel in FIG. 1A.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 2:
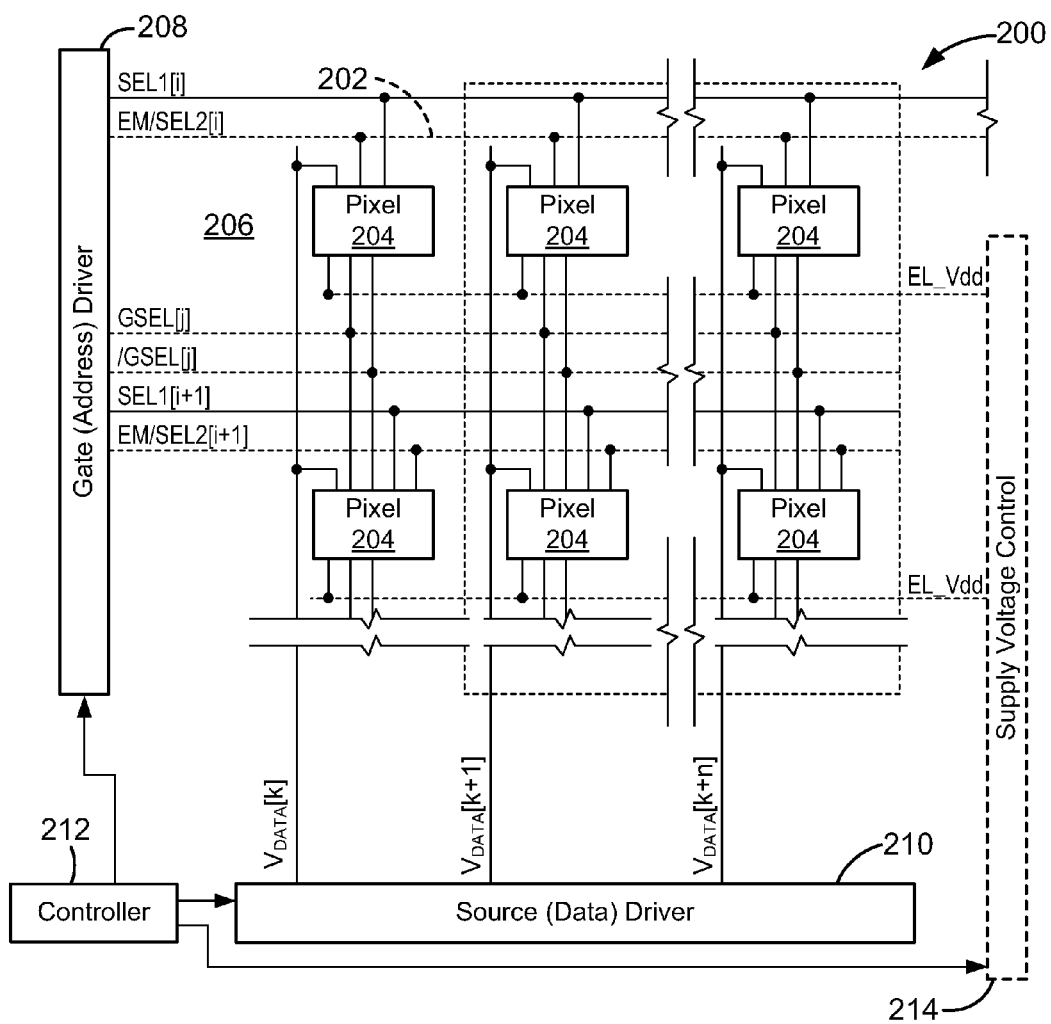
FIG. 2 is a block diagram of an AMOLED display with reference pixels to correct data for parameter compensation control.

FIG. 2 is an electronic display system 200 having an active matrix area or pixel array 202 in which an array of active pixels 204 are arranged in a row and column configuration.

Each of the active pixels 204 includes red, green and blue organic light emitting devices (OLED) to emit different color components that are combined to produce different colors for emission from the pixel. For ease of illustration, only two rows and columns of pixels are shown. External to the active matrix area 202 is a peripheral area 206 where peripheral circuitry for driving and controlling the pixel array 202 are located. The peripheral circuitry includes a gate or address driver circuit 208, a source or data driver circuit 210, a controller 212, and an optional supply voltage (e.g., Vdd) driver 214. The controller 212 controls the gate, source, and supply voltage drivers 208, 210, 214. The gate driver circuit 208, under control of the controller 212, operates on address or select lines SEL[i], SEL[i+1], and so forth, one for each row of pixels 204 in the pixel array 202. In pixel sharing configurations described below, the gate or address driver circuit 208 can also optionally operate on global select lines GSEL[j] and optionally/GSEL[j], which operate on multiple rows of pixels 204 in the pixel array 202, such as every two rows of pixels 204. The source driver circuit 210, under control of the controller 212, operates on voltage data lines Vdata[k], Vdata[k+1], and so forth, one for each column of pixels 204 in the pixel array 202. The voltage data lines carry voltage programming information to each pixel 204 indicative of brightness of each of the color components of the light emitting devices in the pixel 204. A storage element, such as a capacitor, in each of the light emitting devices of the pixels 204 stores the voltage programming information until an emission or driving cycle turns on each of the light emitting devices. The optional supply voltage driver 214, under control of the controller 212, controls a supply voltage (VDD) line, one for each row of pixels 204 in the pixel array 202.

The display system 200 may also include a current source circuit, which supplies a fixed current on current bias lines. In some configurations, a reference current can be supplied to the current source circuit. In such configurations, a current source control controls the timing of the application of a bias current on the current bias lines. In configurations in which the reference current is not supplied to the current source circuit, a current source address driver controls the timing of the application of a bias current on the current bias lines.

As is known, each pixel 204 in the display system 200 needs to be programmed with data indicating the brightness of each of the light emitting devices in the pixel 204 to produce the desired color to be emitted from the pixel 204. A frame defines the time period that includes a programming cycle or phase during which each and every pixel 204 in the display system 200 is programmed with programming voltages indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system 200. There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 200 are programmed first, and all of the pixels are driven row-by-row. Either scheme can employ a brief vertical blanking time at the beginning or end of each frame during which the pixels are neither programmed nor driven.

The components located outside of the pixel array 202 may be located in a peripheral area 206 around the pixel array 202 on the same physical substrate on which the pixel array 202 is disposed. These components include the gate driver 208, the source driver 210 and the optional supply voltage control 214. Alternately, some of the components in the peripheral area can be disposed on the same substrate as the pixel array 202 while other components are disposed on a different substrate, or all of the components in the peripheral area can be disposed on a substrate different from the substrate on which the pixel array 202 is disposed. Together, the gate driver 208, the source driver 210, and the supply voltage control 214 make up a display driver circuit. The display driver circuit in some configurations may include the gate driver 208 and the source driver 210 but not the supply voltage control 214.

The display system 200 further includes a current supply and readout circuit, which reads output data from data output lines, VD [k], VD [k+1], and so forth, one for each column of pixels 204a, 204c in the pixel array 202. The drive transistors for the OLEDs in the pixels 204 in this example are thin film transistors that are fabricated from amorphous silicon. Alternatively, the drive transistors may be fabricated from polysilicon.

In the configurations for the OLEDs described below, the aperture ratio is improved through minimizing the blocked area of the OLED emission surface by changing the arrangement of the drive transistors and the OLEDs. Another configuration for top emission allows the light guided from the area that is blocked by the drive transistor and metallic layers such as power and programming lines to a window over the emission surface of the OLED. As a result, the aperture ratio is much larger than actual opening.

The arrangement of OLED and drive transistors described below makes the pixel opening less dependent to the fabrication design rules that require certain distances between OLEDs and certain widths of voltage supply and data lines. This technique allows fabrication of high resolution displays while results in a reasonable aperture ratio without the need for a high resolution fabrication process. Consequently, the use of shadow masks becomes possible, or even easier, for partitioning the pixel for high pixel densities.

Figure 3:
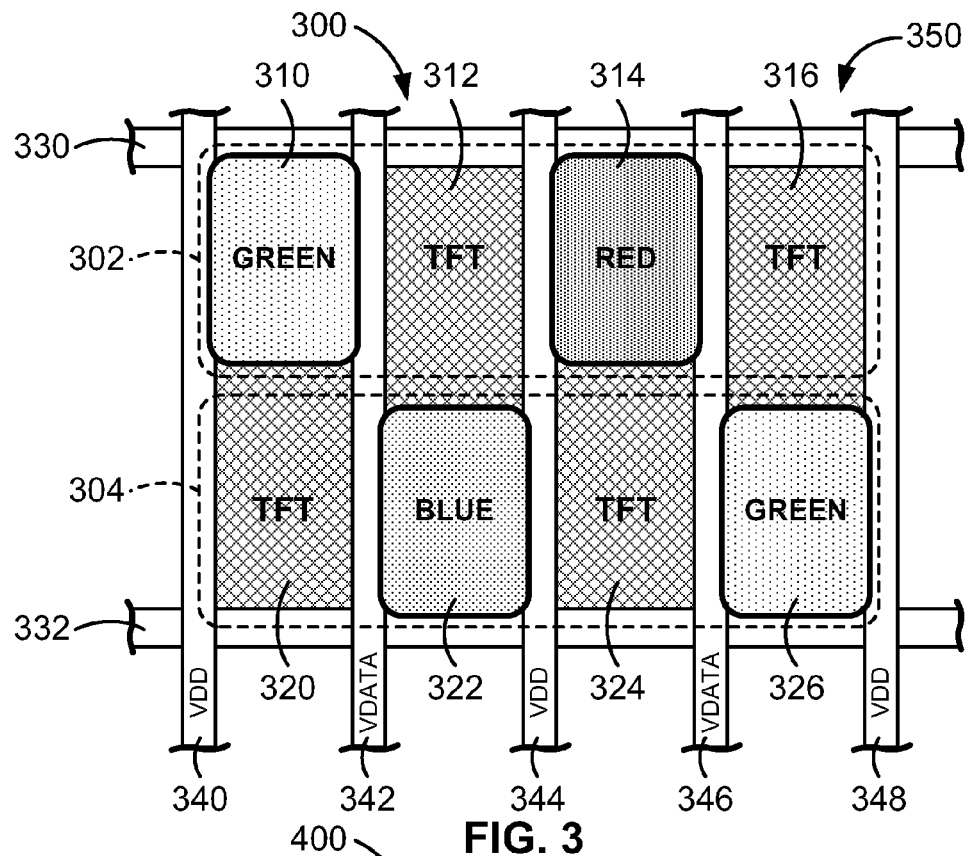
FIG. 3 is a configuration of an integrated circuit for a RGB type pixel having staggered OLEDs for increased aperture.

FIG. 3 shows a top view of an integrated circuit layout for a pixel 300 which is a staggered architecture for a RGB bottom emission pixel. The integrated circuit layout of the pixel 300 includes a top subrow 302 and a bottom subrow 304 each having a series of OLEDs. Each of the OLEDs constitute a sub-pixel in the individual pixels such as the pixel 300. The sub-pixels (e.g. green, red and blue) alternate between the subrows. In this example, the top subrow 302 includes a green OLED 310, a drive transistor 312, a red OLED 314 and a drive transistor 316. The bottom subrow 304 includes a drive transistor 320, a blue OLED 322, a drive transistor 324 and a green OLED 326. A select line 330 is fabricated on top of the top subrow 302 and a select line 332 is fabricated on the bottom of the bottom subrow 304. The drive transistor 316 and the green OLED 326 belong to a next pixel 350 in the array and share the select lines 330 and 332 with the pixel 300. The OLEDs 310, 314 and 322 in the pixel 300 are therefore in staggered arrangement allowing them to be placed closer together side by side. It is to be understood that the term subrow is simply used for convenience. From another perspective, the different OLEDs may be staggered on adjacent columns. The various OLEDs are arranged so certain OLEDs are next to each other and other OLEDs are above or below the OLEDs next to each other in order to allow the increase in the width of the OLEDs.

A power line 340 borders both the green OLED 310 and the drive transistor 320. A data line 342 is fabricated between the green OLED 310 and the drive transistor 312 of the top subrow 302 and continues between the drive transistor 320 and the blue OLED 322 of the bottom subrow 304. A power line 344 is fabricated between the drive transistor 312 and the red OLED 314 of the top subrow 302 and continues between the blue OLED 322 and the drive transistor 324 of the bottom subrow 304. The structure of the pixel 300 also includes a data line 346 fabricated between the red OLED 314 and the drive transistor 316 of the top subrow 302 and continues between the transistor 324 and the green OLED 326 of the bottom subrow 304. Another power line 348 borders the drive transistor 316 of the top subrow 302 and the green OLED 326 of the bottom subrow 304. The drive transistor 316 and the green OLED 326 are part of the next pixel 350 adjacent to the pixel 300 but share the data line 346.

In FIG. 3, the display circuit of the pixel 300 is divided into the two subrows 302 and 304. The OLEDs 310, 322 and 314 are put on top and bottom side of the pixel area alternatively. As a result, the distance between two adjacent OLEDs will be larger than the minimum required distance. Also, the data lines such as the data lines 342 and 346 may be shared between two adjacent pixels such as the pixel 300 and the adjacent pixel 350. This results in a large aperture ratio because the distance between the OLEDs such as the OLED 310 and the OLED 322 may be reduced due to the staggered configuration resulting in larger emission areas of the OLEDs. Since the OLEDs in the pixel 300 share power lines, the surface area necessary for such lines is reduced allowing the area to be open to the emission surfaces of the OLEDs therefore further increasing the aperture ratio.

Figure 4:
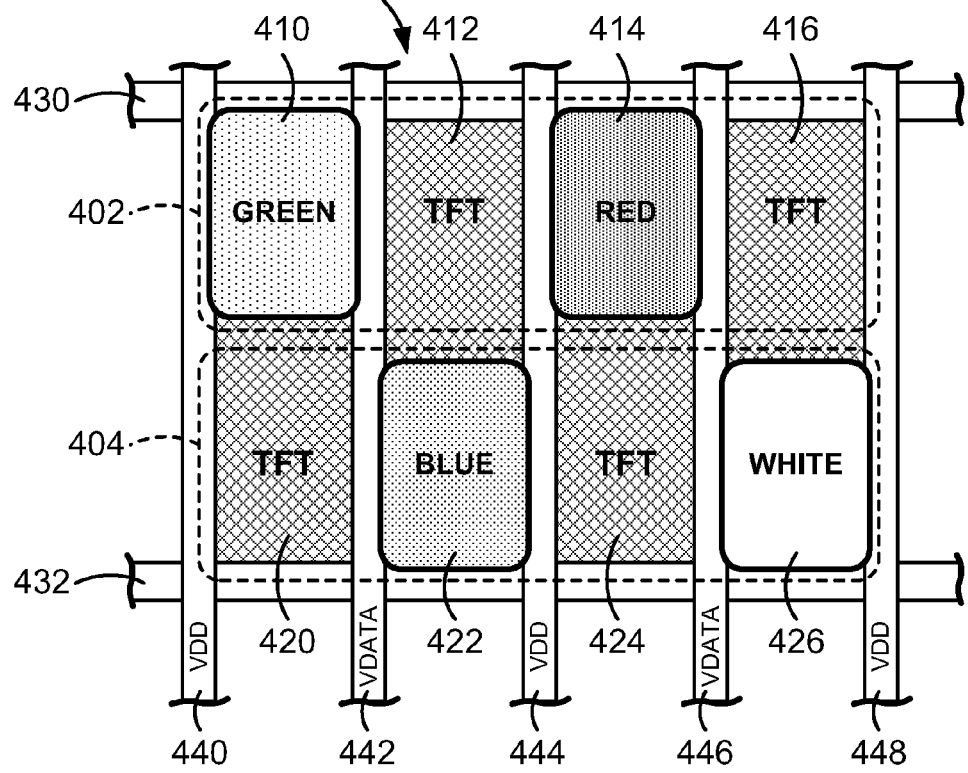
FIG. 4 is a configuration of an integrated circuit for a RGBW type pixel having staggered OLEDs for increased aperture.

FIG. 4 shows an example staggered architecture for a RGBW bottom emission display pixel circuit 400. The integrated circuit layout for the pixel 400 includes a top subrow 402 and a bottom subrow 404. In this example, the top subrow 402 includes a green OLED 410, a drive transistor 412, a red OLED 414 and a drive transistor 416. The bottom subrow 404 includes a drive transistor 420, a blue OLED 422, a drive transistor 424 and a white OLED 426. FIG. 4 shows the entire pixel which includes the four OLEDs 410, 414, 422 and 426.

A select line 430 is fabricated on top of the top subrow 402 and a select line 432 is fabricated on the bottom of the bottom subrow 404. A power line 440 borders both the green OLED 410 and the drive transistor 420. A data line 442 is fabricated between the green OLED 410 and the drive transistor 412 of the top subrow 402 and continues between the drive transistor 420 and the blue OLED 422 of the bottom subrow 404. A power line 444 is fabricated between the drive transistor 412 and the red OLED 414 of the top subrow 402 and continues between the blue OLED 422 and the drive transistor 424 of the bottom subrow 404. The circuit 400 also includes a data line 446 fabricated between the red OLED 414 and the drive transistor 416 of the top subrow 402 and continues between the drive transistor 424 and the white OLED 426 of the bottom subrow 404. Another power line 448 borders the drive transistor 416 of the top subrow 402 and the white OLED 426 of the bottom subrow 404. The power lines 440 and 448 are shared by adjacent pixels (not shown).

As with the configuration in FIG. 3, the pixel circuit 400 in FIG. 4 has an increased aperture ratio because the distance between parallel OLEDs may be decreased due to the staggered relationship between the OLEDs 410, 414, 422 and 426. The white OLED 426 is added since most of the display using the pixel circuit 400 typically emits white color and the white OLED 426 reduces continuous emissions from the blue OLED 422 which is primarily employed to emit white color in RGB type pixels such as the pixel 300 in FIG. 3. As with the configuration in FIG. 3, the distances between the OLEDs may be decreased resulting in greater exposure of the emission surface areas. Further, the sharing of the data and power supply lines also reduces the area necessary for such lines resulting in additional surface emission area being exposed for the OLEDs.

Figure 5:
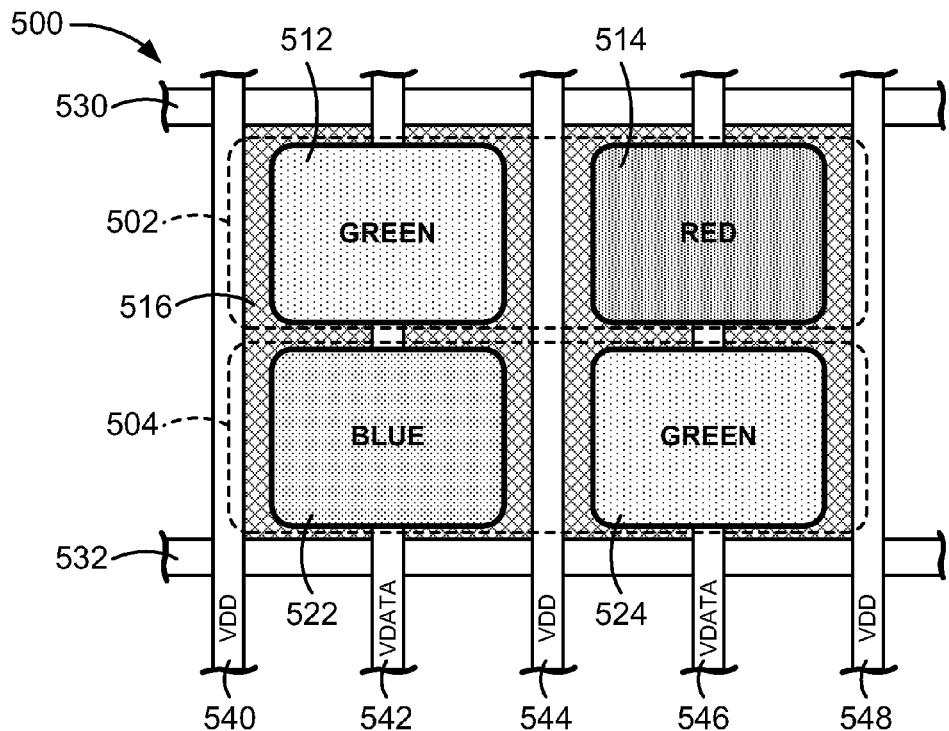
FIG. 5 is a configuration of an integrated circuit for a top emission arrangement for an RGB OLED pixel.

The same staggered arrangement as shown in FIGS. 3 and 4 may be used for the top emission type OLED integrated circuit. FIG. 5 shows a staggered color patterning for a RGB top-emission display structure 500. The structure 500 includes a top subrow 502 and a bottom subrow 504. The top subrow 502 includes a green OLED 512 and a red OLED 514. The drive transistors to drive the OLEDs 512 and 514 are mounted on a lower circuit layer 516 under the OLEDs 512 and 514. The bottom subrow 504 includes a blue OLED 522 and a green OLED 524. Drive transistors that drive the OLEDs 522 and 524 are fabricated on a circuit layer 526 under the OLEDs 522 and 524. In the display structure 500, the OLEDs 512, 514 and 522 make up one pixel, while the green OLED 524 is part of another pixel. Thus the structure 500 results in a display with interlocked pixels which share various data lines. Such pixels require some interpolation of image data since the data lines are shared between the OLEDs of the pixels.

A select line 530 is fabricated on top of the top subrow 502 and a select line 532 is fabricated on the bottom of the bottom subrow 504. A power line 540 borders both the green OLED 512 and the blue OLED 522. A data line 542 is fabricated under the green OLED 512 and of the top subrow 502 and continues under the blue OLED 522 of the bottom subrow 504. The data line 542 is used to program the green OLED 512 and the blue OLED 522. A power line 544 is fabricated between the green OLED 512 and the red OLED 514 of the top subrow 502 and continues between the blue OLED 522 and the green OLED 524 of the bottom subrow 504. A data line 546 fabricated over the red OLED 514 of the top subrow 502 and continues over the green OLED 524 of the bottom subrow 404. The data line 546 is used to program the red OLED 514 and the green OLED 524. Another power line 548 borders the red OLED 514 of the top subrow 502 and the green OLED 524 of the bottom subrow 504. The power lines 540 and 548 are shared by the transistors and OLEDs of adjacent pixels.

In this case, sharing the data programming lines 542 and 546 (VDATA) in the top emission structure 500 leads to more area for the drive transistors under the OLEDs. As a result, the drive transistors in the emission structure 500 may have larger source, drain and gate regions and the aging of the drive transistors will be slower because of lower current densities required by the transistors.

The emission structure 500 allows reduction of distance between the OLEDs 512 and 522 because of the staggered arrangement. The OLEDs 512, 514, 522 and 524 may be made wider than a known OLED, but with a relatively shorter length. The wider OLED surface results in increased aperture ratio. The emission structure 500 requires a processed image data signal from a raw RGB signal because the OLEDs are staggered with OLEDs from the adjacent pixels. The transparent common electrode (not shown) over the OLEDs 512, 514, 522 and 524 has relatively lower resistance because of the wider areas of the OLEDs 512, 514, 522 and 524.

Figure 6:
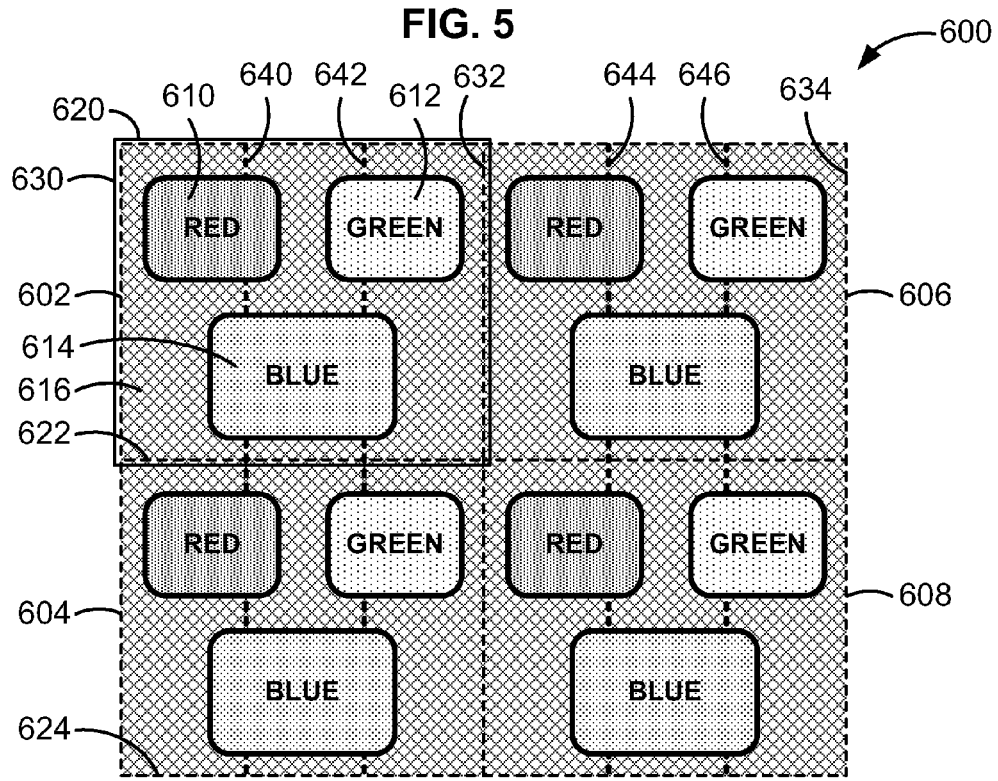
FIG. 6 is an alternate configuration for an integrated circuit for a top emission RGB OLED pixel.

FIG. 6 shows an alternate pixel arrangement 600 for a top emission structure. The pixel arrangement 600 improves the aperture ratio and relaxes OLED manufacturing requirements. The pixel arrangement 600 includes different pixels 602, 604, 606 and 608. Each of the pixels has three OLEDs such as OLEDs 610, 612 and 614 which are disposed on a circuit layer 616 that includes the drive transistors to drive each of the OLEDs 610, 612 and 614. In this case, the OLED 610 emits green light and is in a row with the OLED 612 that emits red light. The OLED 614 emits a blue light and has a larger emission surface than the OLEDs 610 and 612. Select lines such as select lines 620, 622 and 624 run on the top and the bottom of the pixels 602, 604, 606 and 608. Power supply lines 630, 632 and 634 run along the sides of the pixels 602, 604, 606 and 608 to supply voltages for the OLEDs 610, 612 and 614 and their respective drive transistors. Data lines 640, 642, 644 and 646 run under the OLEDs of the pixels 602, 604, 606 and 608. For example, the data line 640 is used to program the OLED 610, the data line 642 is used to program the OLED 612 and either data line 640 or 642 is used to program the OLED 614 in the pixel 602.

In the structure 600, any single current is within one subrow. As a result, the lines look straighter in a display composed of pixels using the arrangement 600 and so provide better quality for text application. The OLED 614 that emits blue light is larger than the OLEDs 610 and 612, covering substantially the entire width of the pixel 602, because the increased surface area for the blue color OLED 614 retards aging which is the result of inherent faster aging for a blue color OLED. The increased surface area requires lower current density to produce the same output as a smaller surface OLED and therefore ages slower. The structure 600 in FIG. 6 has an improved appearance over the structure 500 in FIG. 5 because the red, green and blue OLED elements are in a straight line as opposed to being staggered between pixels. As with the structure 500 in FIG. 5, the transparent common electrode (not shown) over the OLEDs 610, 612 and 614 has relatively lower resistance because of the wider areas of the OLEDs 610, 612 and 614.

Figure 7:
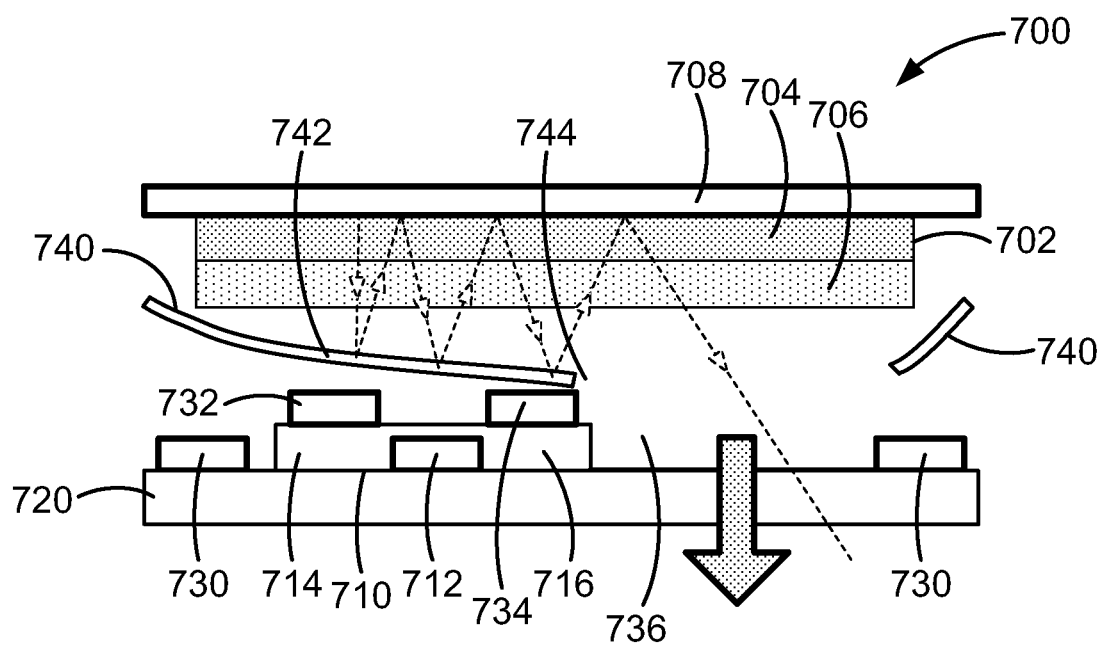
FIG. 7 is a cross section view of an OLED pixel with a reflector to increase luminance output from the pixel.

FIG. 7 shows the cross section of a pixel structure 700 that is a modified bottom emission type pixel that increases aperture ratio by having a reflector 740 focus light emitted from the areas of the emission area of an OLED 702 that are covered by other circuit components. The OLED 702 includes a cathode layer 704 and an anode layer 706. A common electrode layer 708 provides electrical bias to the other side of the OLED 702. The common electrode 708 can be shaped as a concave minor to reflect more light toward a reflective surface 742 of the reflector 740. A drive transistor 710 is fabricated over part of the emission surface of the OLED 702. The drive transistor 710 includes a gate 712, a drain region 714 and a source region 716. The drive transistor 710 is fabricated on a clear substrate layer 720 that overlays the OLED 702. A metallization layer 730 is overlaid on the clear substrate 720 to form electrodes 732 and 734 contacting the drain region 714 and the source region 716 of the drive transistor 710 respectively and provide electrical connections to the other components of the circuit such as data and voltage supply lines. An electrode is also formed to the gate of the transistor 710 (not shown). The metallization layer 730 includes an aperture 736 through which light from the OLED 702 may be emitted through the clear substrate 720.

The pixel structure includes a reflector 740 that is disposed between the OLED 702 and the drive transistor 710. The reflector 740 includes a reflective surface 742 facing the emission surface of the OLED 702 that reflects light emitted from the OLED 702 that would be normally blocked by the drive transistor 710. The reflected light (shown in arrows in FIG. 7) is emitted out a window 744 in the reflector 740 to therefore increase the light actually emitted from the OLED 702.

Thus the OLED emission area is not limited to the opening window which is defined by the drive transistor and supporting components on the OLED 702. As a result, the OLED current density for a given luminance is lower than a conventional bottom emission arrangement. This arrangement including the reflector 740 requires lower OLED voltage and therefore lower power consumption to achieve the same luminance as a conventional OLED without the reflector. Moreover, the lifetime of the OLED 702 will be longer due to lower current density. This structure 700 may also be used with other techniques to further improve aperture ratio.

Figure 8A:
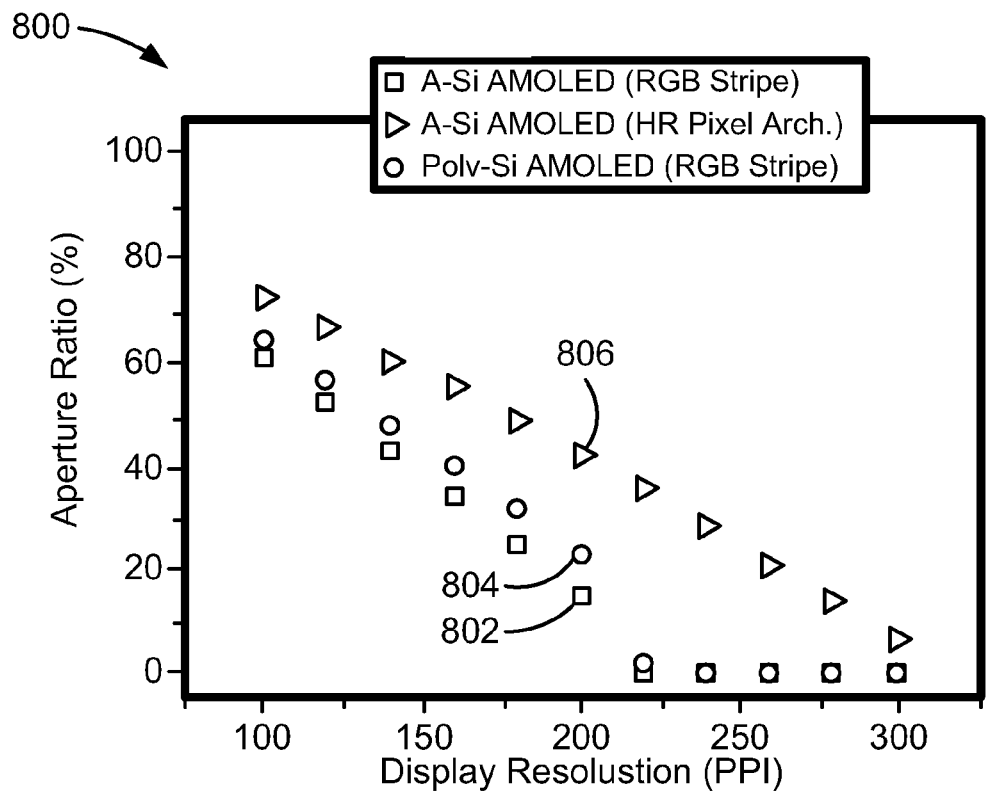
FIG. 8A is a graph of the aperture ratios of a known stripe arrangement of OLEDs in a pixel in comparison with the staggered arrangement in FIG. 3

The aperture ratio for different display resolutions is demonstrated in a graph 800 in FIG. 8A. The graph 800 compares the aperture ratios of various configurations to display resolutions. One set of data points 802 shows the aperture ratios of a standard amorphous silicon red green blue pixel stripe structure as shown in FIG. 1A. A second set of data points 804 shows the aperture ratios of a standard polysilicon red green blue pixel stripe structure. As shown in FIG. 8A, the polysilicon based pixel has slightly better aperture ratios than the amorphous silicon based pixel. A third set of data points 806 shows the aperture ratios of a bottom emission staggered structure such as the structure of the pixel 300 shown in FIG. 3. As shown in the data points 802 in FIG. 8A, while the aperture ratio for higher resolution (e.g., 250 PPI) using a standard RGB stripe configuration is zero, the aperture ratio of the staggered pixel architecture in FIG. 3 in data points 806 is higher than 20% for up to 260 PPI.

Figure 8B:
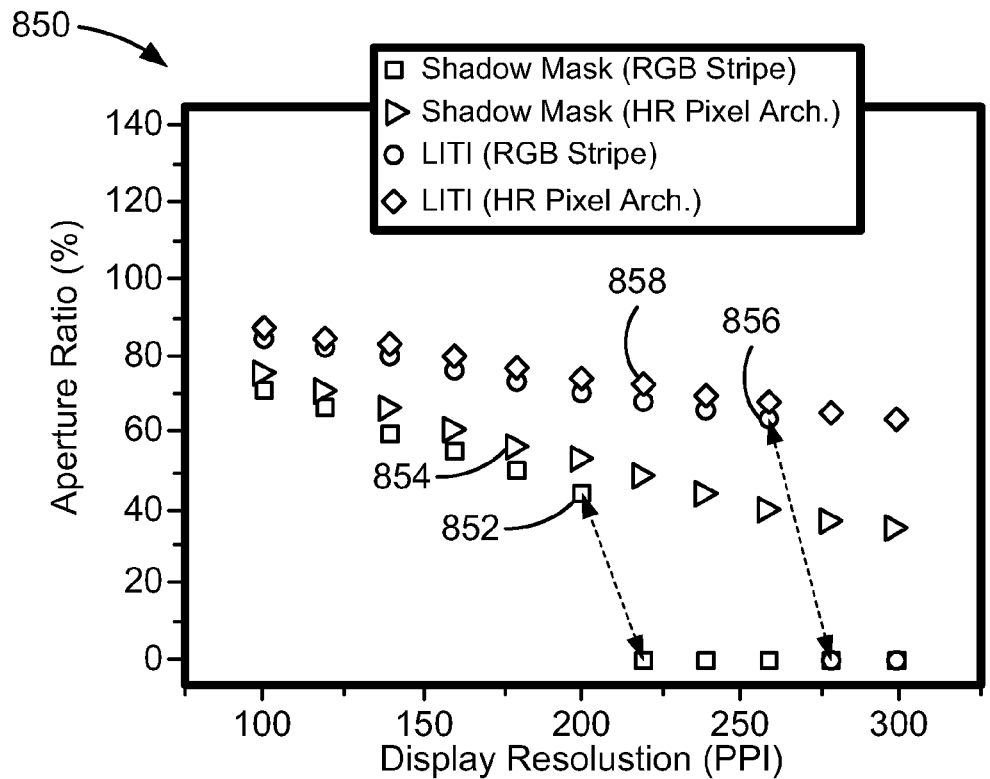
FIG. 8B is a graph of the aperture ratio of known stripe arrangements of OLEDs in a pixel in comparison with a staggered top emission arrangement such as that in FIG. 7.

FIG. 8B is a graph 850 showing the plots of aperture ratios at different display resolutions for various OLED pixel structures. One set of data points 852 shows the aperture ratios of a standard amorphous silicon red green blue pixel stripe structure as shown in FIG. 1A fabricated with a shadow mask. A second set of data points 854 shows the aperture ratios of an amorphous silicon bottom emission staggered structure such as the structure of the pixel 300 shown in FIG. 3 fabricated with a shadow mask. Another set of data points 856 shows the aperture ratios of a top emission type structure in a red green blue pixel strip structure fabricated by laser induced thermal imaging (LITI). A final set of data points 858 shows the aperture ratios of a top emission type structure using the staggered arrangement shown in FIG. 7 fabricated by LITI.

The aperture ratio is extracted for two types of OLED patterning (shadow mask with a 20-μm gap and LITI with a 10-μm gap) as shown in the data points 852 and 856 for a stripe type arrangement as shown in FIG. 1A. In the case of shadow mask fabrication, the aperture ratio for RGB stripe is limited by OLED design rules whereas a RGB stripe using LITI fabrication is limited by the TFT design rules. However, for both shadow mask and LITI fabrication, staggered color patterning can provide high resolution (e.g. 300 ppi) with large aperture ratio as shown by the data points 854 and 858. This resolution is provided without mandating tighter design rules as compared with conventional OLED layouts.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. An integrated circuit for a color pixel having multiple sub-pixels arranged in rows and columns, the circuit comprising:
 a first organic light emitting device having front and rear surfaces and emitting light of a first color from the front surface;
 a second organic light emitting device having front and rear surfaces and emitting light of a second color from the front surface, the first and second organic light emitting devices located in different rows and columns;
 a third organic light emitting device having front and rear surfaces and emitting light of a third color from the front surface, said third organic light emitting device located in the same row as one of said first and second organic light emitting devices, and in the same column as the other of said first and second organic light emitting devices; and
 a plurality of drive transistors being located behind the rear surfaces of the first, second and third organic light emitting devices; and
 data lines extending across the rear surfaces of the organic light emitting devices.

2. The integrated circuit of claim 1, further comprising:
 a first drive transistor controlling the luminance of the first organic light emitting device located under the first organic light emitting device;
 a second drive transistor next to the first light emitting device, the second drive transistor controlling the luminance of the second organic light emitting device; and
 a third drive transistor controlling the luminance of the third organic light emitting device, the third drive transistor located next to the second organic light emitting device and under the third organic light emitting device.

3. The integrated circuit of claim 1, further comprising a voltage line coupled on one side of the first organic light emitting device, a data line coupled between the first organic light emitting device and the second organic light emitting device.

4. The integrated circuit of claim 1, further comprising a select line to activate the programming of the organic light emitting devices coupled to the first organic light emitting device, the second drive transistor and the third organic light emitting device.

5. The integrated circuit of claim 1, further comprising a fourth organic light emitting device located next to the third drive transistor and a fourth drive transistor controlling the luminance of the fourth organic light emitting device located next to the third organic light emitting device, wherein the fourth organic light emitting device emits white light.

6. The integrated circuit of claim 1, wherein the first color is green, the second color is blue and the third color is red.

7. The integrated circuit of claim 1, wherein the organic light emitting devices are fabricated using one of a shadow mask process or a laser induced thermal imaging process.

8. An integrated circuit for a color pixel having multiple sub-pixels arranged in rows and columns, the circuit comprising:
 a first organic light emitting device emitting light of a first color;
 a second organic light emitting device emitting light of a second color, the first and second organic light emitting devices located in different rows and columns;
 a third organic light emitting device emitting light of a third color, said third organic light emitting device located in the same row as one of said first and second organic light emitting devices, and in the same column as the other of said first and second organic light emitting devices;
 a drive transistor disposed on the light-emitting side of at least one of said organic light emitting devices;
 a reflective common electrode on the opposite side of said at least one organic light emitting device from said light-emitting side; and
 a reflector layer disposed between said drive transistor and the light-emitting side of said at least one of the organic light emitting devices, the reflector layer having a reflective surface facing the organic light emitting device and forming an aperture, said reflective surface being shaped to reflect light emitted from said light-emitting side of the organic light emitting device back toward said reflective common electrode at angles that cause said light to be reflected from said common electrode through said aperture.

9. A color display comprising:
a controller;
an array of pixels coupled to the controller to display images, wherein each pixel includes:
a first organic light emitting device emitting light of a first color;
a second organic light emitting device emitting light of a second color, the first and second organic light emitting devices located in different rows and columns;
a third organic light emitting device emitting light of a third color, said third organic light emitting device located in the same row as one of said first and second organic light emitting devices, and in the same column as the other of said first and second organic light emitting devices;
first, second and third drive transistors coupled to the first, second and third organic light emitting devices, respectively;
wherein the organic light emitting devices are located on a substrate and the drive transistors are fabricated on the rear surfaces of said organic light emitting devices; and
data lines fabricated behind the organic light emitting devices.

10. The color display of claim 9, wherein the organic light emitting devices are located on a substrate and the drive transistors are fabricated on the organic light emitting devices, the first drive transistor located on the bottom row under the first organic light emitting device, the second drive transistor located in the top row next to the first light emitting device, and the third drive transistor located on the bottom row next to the second organic light emitting device and under the third organic light emitting device.

11. The color display of claim 9, wherein each pixel further includes a fourth organic light emitting device located next to the third drive transistor on the bottom row and a fourth drive transistor controlling the luminance of the fourth organic light emitting device located next to the third organic light emitting device on the top row, wherein the fourth organic light emitting device emits white light.

12. The color display of claim 9, wherein the first color is green, the second color is blue and the third color is red.

13. The color display of claim 9, wherein the first color is green, the second color is blue and the third color is red, wherein the second organic light emitting device has an emission area larger than the emission areas of the first and second light emitting devices.

14. An integrated circuit for a pixel, the integrated circuit comprising:
a reflective common electrode layer;
an organic light emitting device located on the common electrode layer, the organic light emitting device including an emission surface;
a drive transistor disposed on part of the emission surface side of said organic light emitting device; and
a reflector layer disposed between the drive transistor and the emissive surface side of said organic light emitting device, the reflector layer including an aperture over the emission surface and a reflective surface facing the emission surface, the reflective surface being shaped to reflect light emitted from the light emitting surface back toward said reflective common electrode at angles that cause said light to be reflected from said common electrode through said aperture.

* * * * *